United States Patent [19]
Bauer et al.

[11] Patent Number: 5,698,867
[45] Date of Patent: Dec. 16, 1997

[54] TURN-OFF, MOS-CONTROLLED, POWER SEMICONDUCTOR COMPONENT

[75] Inventors: Friedhelm Bauer, Baden; Raymond Vuilleumier, Fontainemelon, both of Switzerland

[73] Assignee: Asea Brown Boveri Ltd., Baden, Switzerland

[21] Appl. No.: 409,967

[22] Filed: Mar. 24, 1995

Related U.S. Application Data

[63] Continuation of Ser. No. 162,801, Dec. 7, 1993, abandoned, which is a continuation of Ser. No. 855,839, Mar. 20, 1992, abandoned.

[30] Foreign Application Priority Data

Apr. 11, 1991 [EP] European Pat. Off. ............ 91105724.8

[51] Int. Cl.$^6$ .............................. H01L 29/74; H01L 31/111
[52] U.S. Cl. ................................................ 257/138; 257/139
[58] Field of Search .................................. 257/138, 139, 257/143, 144

[56] References Cited

U.S. PATENT DOCUMENTS 4,611,128  9/1986  Patalong ........................ 307/252 B

FOREIGN PATENT DOCUMENTS

| | | |
|---|---|---|
| 028797 | 5/1981 | European Pat. Off. . |
| 219995 | 4/1987 | European Pat. Off. . |
| 340445 | 4/1988 | European Pat. Off. . |
| 4024526 | 8/1989 | European Pat. Off. . |
| 0340445 | 11/1989 | European Pat. Off. . |
| 4024526 | 2/1991 | Germany . |
| 63-310171 | 12/1988 | Japan . |
| 63-370171 | 12/1988 | Japan . |

OTHER PUBLICATIONS

Baliga et al., "The Insulated Gate Transistor . . . ", IEEE Trans on ED, vol. ED31 No.6, Jun. 1984.
Temple, "MOS-Controlled Thristors . . . ", IEEE Trans on ED, vol. ED33 No. 10, Oct. 1986.
IEEE Transactions on Electron Devices, vol. ED-31, No. 6, Jun. 1984, B.J. Baliga, et al., "The Insulated Gate Transistor: A New Three-Terminal MOS-Controlled Bipolar Power Device" IEEE Transactions on Electron Devices, vol. ED-33, No. 10, Oct. 1986, V.A. Temple, MOS-Controlled Thyristors-A New Class of Power Devices.

*Primary Examiner*—Stephen Meier
*Attorney, Agent, or Firm*—Oblon, Spivak, McClelland, Maier & Neustadt, P.C.

[57] ABSTRACT

In a MOS-controlled turn-off thyristor (MCT), a conventional integral cell with a combined emitter and short-circuiting function is replaced by a separate DMOS cell (D) and emitter cell (E). The DMOS cell (D) contains a five-layer sequence of cathode short-circuit region (18), first channel region (19), second base layer (7), first base layer (8) and emitter layer (9). The emitter cell (E) contains a four-layer sequence of first emitter region (20), second base layer (7), first base layer (8) and emitter layer (9). This basic structure produces a component which is easy to produce and is distinguished by a high reverse-blocking capability.

8 Claims, 6 Drawing Sheets

TURN-OFF, MOS-CONTROLLED, POWER SEMICONDUCTOR COMPONENT

This application is a Continuation of application Ser. No. 08/162,801, filed on Dec. 7, 1993, now abandoned, which is a Continuation of application Ser. No. 07/855,839, filed on Mar. 20, 1992, now abandoned.

BACKGROUND OF THE INVENTION

1. Field of the Invention

The present invention relates to the field of power electronics. It relates in particular to a turn-off, MOS-controlled power semiconductor component comprising (a) a semiconductor substrate of a first conductivity type, which semiconductor substrate is bounded on one side by a first principal face and on the other side by a second principal and forms a first base layer in its interior;

(b) an emitter layer of a second conductivity type opposite to the first, which emitter layer projects from the second principal face into the first base layer;

(c) a second base layer of the second conductivity type, which second base layer projects from the first principal face into the first base layer;

(d) a plurality of first emitter regions of the first conductivity type, which project from the first principal face into the second base layer;

(e) a plurality of first channel regions of the first conductivity type, which project from the first principal face into the second base layer;

(f) a plurality of cathode short-circuit regions of the second conductivity type, which are let into the first channel regions from the first principal face in each case, the first channel regions being led up outside the cathode short-circuit regions to the first principal face;

(g) first gate electrodes, which are arranged above the first principal face over the led-up first channel regions in each case and insulated from the semiconductor substrate;

(h) a cathode contact which is applied to the first principal face and contacts the first emitter regions and the cathode short-circuit regions; and (i) an anode contact which is applied to the second principal face and contacts the emitter layer;

Such a component is known, for example, from the printed publication EP-A1-0,340,445.

2. Discussion of Background

For some years now the development of MOS-controlled components has been increasingly advanced in power electronics. This trend was introduced by the unipolar power MOSFETs having a DMOS structure.

The advantage of these MOS-controlled components is based principally on the high input impedance at the gate electrode. This impedance enables the component to be driven with a comparatively very low power expenditure.

The DMOSFETs have, however, an important disadvantage: because of the unipolar nature of conductance, high breakdown voltages must be paid for in these components by high forward resistances, which limit the maximum current intensity.

A short while ago, a solution to this problem became available with the IGBT (Insulated Gate Bipolar Transistor) (see in this connection: B. J. Baliga et al., IEEE Trans. Electron Devices, ED-31, pages 821–828 (1984)).

The IGBT has a cathode structure which largely resembles that of the DMOSFET. It can be understood in a simplified way as a cascade connection of a DMOSFET and a bipolar transistor. In consequence of the bipolar current transport in the high-resistance n-base layer, the conductivity of this region is modulated; it is thus possible to realize a low value for the forward resistance even in the case of components having a high reverse voltage.

It is now proposed, furthermore, to implement the described concept of controlling power semiconductor components via MOS gates in the case of components of the highest power class as well, that is to say in the case of thyristors (in this regard, see the article by V.A.K. Temple, IEEE Trans. Electron Devices, ED-33, pages 1609–1618 (1986)).

In such a MOS-controlled thyristor or MCT (MOS Cntrolled Thyristor), which consists of a multiplicity of integral cells that are located next to one another and connected in parallel, the turn-off is achieved via a short circuit of the emitter to the p-base by means of switchable emitter shorts. In this case, MOSFETs that are integrated with the emitter and can, by its nature, optionally be constructed as n-channel or p-channel MOSFETs serve as switches.

With regard to simple circuit engineering, it is, of course, desirable to turn the thyristor not only off but also on with the aid of the MOS gates. This should be achievable, if possible, using a single gate electrode.

A structure which fulfills these requirements has already been proposed in said article by V.A.K. Temple (in FIG. 5 there). At issue in this case is a combined turn-on and turn-off cell in which use is made within the original MCT integral cell of a further DMOS structure, in order to inject electrons into the n-base layer via a channel in the p-base layer that is raised to the substrate surface.

However, this known combined turn-on and turn-off cell presents two problems:

The channel of the DMOSFET used for turn-on is formed by the p-base layer that is taken to the surface. For typical thyristors, the depth of this p-base layer varies in the range of at least 20 micrometers. This dimension then also corresponds approximately to the channel length of the DMOSFET. It is thus substantially larger than the typical channel lengths of IGBTs, which are approximately 1 micrometer. Because of the large channel length, fewer electrons are injected into the n-base layer, as a result of which during turn-on the efficient build up of a plasma is impeded and the turn-on time is lengthened.

On the other hand, it is a result of the use of combined turn-on and turn-off cells that at most exactly the same number of turn-on and turn-off elements are present in the component. Consequently, there is no possibility of optimizing the number and distribution of these elements independently of one another with regard to the requirements placed on the component.

In order to remedy these problems, it was proposed in the printed publication EP-A1-0,340,445 mentioned at the beginning to replace the known combined turn-on and turn-off cells in a MCT by two separate MCT and IGBT integral cells connected in parallel (FIG. 1).

However, a process having at least 13 masking levels is required to produce such a component. Moreover, it is necessary to use a lithography which operates with a very high precision. All these conditions lead to a complex production with high production costs and—as a specific characteristic of silicon technology—to a comparatively low yield of components.

In order to avoid these difficulties, a simplified component has therefore further been proposed (in this connection, see:

Patent Abstracts of Japan, Vol. 13, No. 150 (E-742) [3498], 12 Apr. 1989; or: prior German Patent Application No. P 40 24 526.8), in which two different integral cells are arranged alternately next to one another. One of the two integral cells has a p-n-p three-layer structure, and the other a p-n-p-n four-layer structure (FIG. 2).

The disadvantage of this simplified component is, however, a comparatively low maximum reverse voltage up to approximately 1 kV. For applications in which the highest dielectric strength of the components is required as far as into the range of several kV, they therefore do not come into consideration.

SUMMARY OF THE INVENTION

Accordingly, the object of this invention is to provide a power semiconductor component which can be turned on and off via a single MOS gate, which by virtue of a simplified construction can be produced in comparatively few steps, and which also meets the highest requirements with respect to dielectric strength.

The object is achieved in a component of the type mentioned at the beginning when (k) the first emitter regions and the first channel regions are separated from one another and arranged laterally next to one another and project into the second base layer, each first emitter region and each first channel region with the cathode short-circuit region let into the latter forming together with the layers located therebelow an emitter cell or a DMOS cell, which cells are arranged next to one another and are connected in parallel electrically.

The essence of the invention is that instead of the known MCT integral cell, in which the cathode-side emitter and the MOS-controlled cathode short circuit are combined to form a complex structure that is difficult to produce, individual cells are arranged next to one another, which contain either an emitter (in the case of the emitter cell) or a MOS-controlled short circuit (in the case of the DMOS cell), but not both together.

Apart from the advantages of increased dielectric strength and ease of production, the component according to the invention further has the advantage of a greater flexibility in the design of electrical characteristics, because different numbers of emitter cells and DMOS cells can be combined with one another according to need.

A first preferred embodiment of the component according to the invention is distinguished in that (a) in addition to the emitter cells and the DMOS cells, turn-on cells are provided which are arranged between the emitter cells and DMOS cells and are connected in parallel thereto, each turn-on cell adjoining at least one adjacent emitter cell;

(b) inside each turn-on cell, the second base layer and, in an interruption of the second base layer, the first base layer are led up one after another to the first principal face, the first base layer forming a turn-on region surrounded by the second base layer; and (c) inside each turn-on cell, the first gate electrode also covers the second base layer, which is led up between the turn-on region and the first emitter region of the adjacent emitter cell.

As a result, the turn-on function of the component according to the invention is ensured in a simple way.

Further advantageous embodiments of the invention follow from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

In order to enable a better comparison with the component according to the invention, the prior art in the case of the MCTs may first be explained once again with reference to FIGS. 1 and 2.

Figure 1:
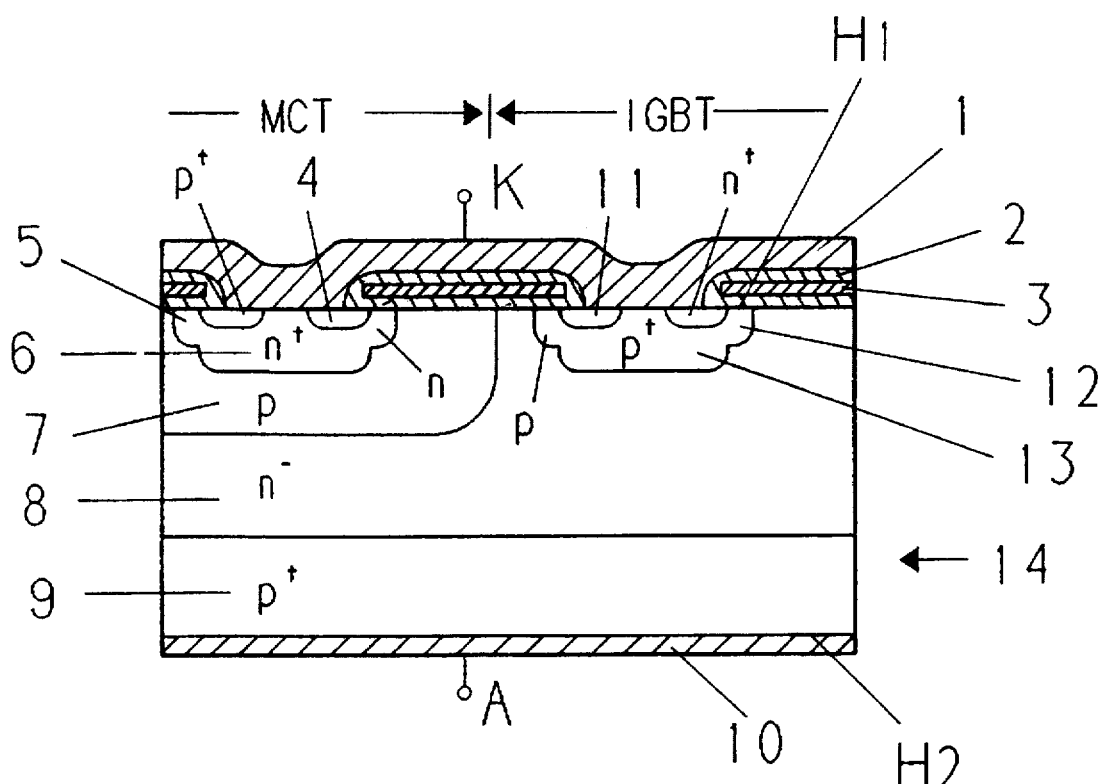
FIG. 1 shows in cross section the integral cells of a first MOS-controlled bipolar power semiconductor component according to the prior art having a comparatively complex internal structure.

Referring now to the drawings, wherein like reference numerals designate identical or corresponding parts throughout the several views, FIG. 1 shows the two different integral cells of a MOS-controlled thyristor as it is known from the printed publication EP-A1-0,340,445 mentioned at the beginning. IGBT cells (right-hand part) and MCT cells (left-hand part) are arranged alternately inside a large-area, wafer-shaped semiconductor substrate 14, which is bounded above (on the side of the cathode K) by a first principal face H1 and below (on the side of the anode A) by a second principal face H2. Common to all cells is a continuous first base layer 8, which is formed by the $n^-$-doped host material of the semiconductor substrate 14, and an anode-side, $p^+$-doped emitter layer 9.

Apart from the first base layer 8 and the emitter layer 9, the IGBT cells, which are provided for turning on the component, each comprise a $p^+$-doped collector region 13, a p-doped channel region 12 and $n^+$-doped source regions 11. Arranged insulated over the channel region 12 is a gate electrode 3 which in the case of a suitable bias generates in the channel region 12 an n-channel via which electrons flow into the first base layer 8 and can produce a hole injection from the emitter layer 9.

In the MCT cells (the turn-off cells), $n^+$-doped emitter regions 7 and n-doped channel regions 5 project from the first principal face H1 into a second, p-doped base layer 7. Again, $p^+$-doped cathode short-circuit regions 4, which are separated from the second base layer 7 by the channel regions 5 raised to the first principal face H1, are let into the channel regions 5 from the first principal face H1. The common gate electrode 3 also extends over the led-up channel regions 5.

Just like the source regions 11 and the collector region 13 of the IGBT cell, the cathode short-circuit regions 4 and the emitter region 6 of the MCT cell are contacted by a cathode contact 1 in the form of a metallic coating. The emitter layer 9 is correspondingly covered by a metallic anode contact 10.

By applying a negative potential (referred to the potential of the cathode K) to the gate electrode 3, the thyristor of FIG. 1 is converted by the MCT cells from the turn-on state into the forward-blocking state. The IGBT cells are additionally provided to improve the turn-on behavior.

Figure 2:
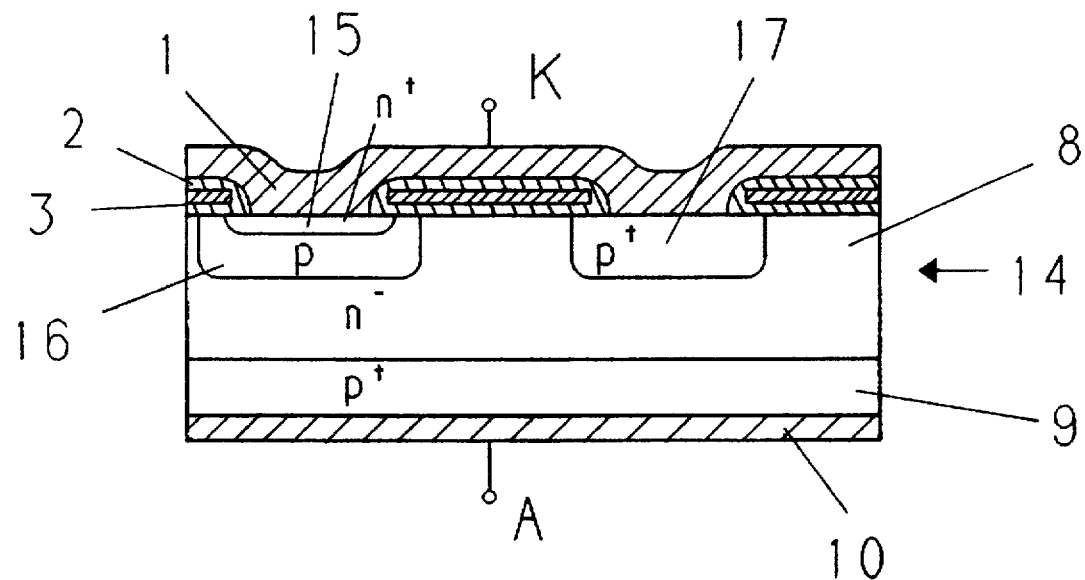
FIG. 2 shows in cross section the integral cells of a second, simplified, MOS-controlled bipolar power semiconductor component according to the prior art.

The other known component structure, which has already been referred to at the beginning, is distinguished in that, as shown in FIG. 2, instead of the complicated MCT and IGBT cells two simplified cell types are connected in parallel. In one cell type (left-hand part of FIG. 2), an $n^+$-doped emitter region 15 and a p-doped base region project nested in one another into the first base layer 8 and form a four-layer structure with the layers located therebelow.

In the other cell type (right-hand part of FIG. 2), a $p^+$-doped contact region 17 is let into the first base layer 8. The base region 16 led up to the sides and the part of the first base layer 8 located between the base region 16 and contact region 17 are covered by the gate electrode 3.

Although the component of FIG. 2 has a greatly simplified structure, as already mentioned at the beginning it does not satisfy higher requirements with respect to the reverse voltage, so that the further considerations proceed from a component according to FIG. 1.

The turn-off cell according to FIG. 1 has a parasitic, vertical p-n-p bipolar structure (hole emitter=second base layer 7; base=channel region 5; hole collector=cathode short-circuit region 4). This parasitic bipolar transistor can accept the holes coming from the anode A irrespective of the voltage at the gate electrode 3. If this takes place, a large number of holes flow via this parasitic path into the cathode short-circuit regions 4, that is to say not via the actual emitter region 6 of the thyristor. The latter thereupon reacts with a correspondingly low emission of electrons. What this means with respect to the electrical characteristics of the thyristor is that such a component has a poor forward characteristic with a high ON resistance, that is to say also high line losses.

A possible measure to combat this undesired mechanism is to render the area of the parasitic bipolar transistor as small as possible. This means that the emitter region 6 must be optimally adjusted with the edge of the poly-Si gate electrode 3, which for its part determines the lateral position of the channel regions 5 and the cathode short-circuit regions 4. In like fashion, all the diffusions should be as flat as possible for the individual regions, in order to obtain very large radii of curvature (and thus low active base areas). These requirements already make plain that a remedy of this type can be implemented only by means of very expensive and complicated technologies (for example by means of a wafer stepper).

The present invention adopts a different way: the two constituents that can be united only with difficulty, that is to say the cathode-side $n^+$-emitter and the MOS-controlled short circuit, are accommodated separated from one another in independent integral cells in the thyristor part of the component (which corresponds to the MCT cell of FIG. 1). A basic embodiment of this solution is reproduced in FIG. 3.

In this case, as well, the semiconductor substrate 14 comprises between two principal faces H1 and H2 the continuous, $n^-$-doped, first base layer 8, the continuous, p-doped, second base layer 7 and the continuous, $p^+$-doped emitter layer 9. Two different types of integral cell are now formed inside the semiconductor substrate 14, an emitter cell E and a DMOS cell D (indicated in FIG. 3 by dashed rectangles).

In the emitter cell E, there is let from the first principal face H1 into the second base layer 7 an $n^+$-doped, first emitter region 20 which together with the layers 7, 8 and 9 located therebelow forms the four-layer structure of a thyristor. In the DMOS cell D with its five-layer structure, there projects from the first principal face H1 into the second base layer 7 an n-doped first channel region 19 into which, for its part, a $p^+$-doped cathode short-circuit region 18 is let. The first channel region 19 is raised outside the cathode short-circuit region 18 to the first principal face H1 and covered there by an insulated first gate electrode 3. The cathode short-circuit region 18 and first emitter region 20 are directly contacted by the cathode contact 1.

By contrast with the five-layer structure of the DMOS cells D, the four-layer structure of the emitter cells E can latch. Given a negative voltage at the first gate electrode 3, the p-channels in the first channel regions 19 become conductive upon turn-off: the cathode short-circuit regions 18 are then directly connected to the second base layer 7. In this case, all the emitter short circuits are activated on the cathode side. In the case of a sufficiently large number of activated short circuits, the thyristor can no longer maintain the latched state, and the component turns off.

Figure 3:
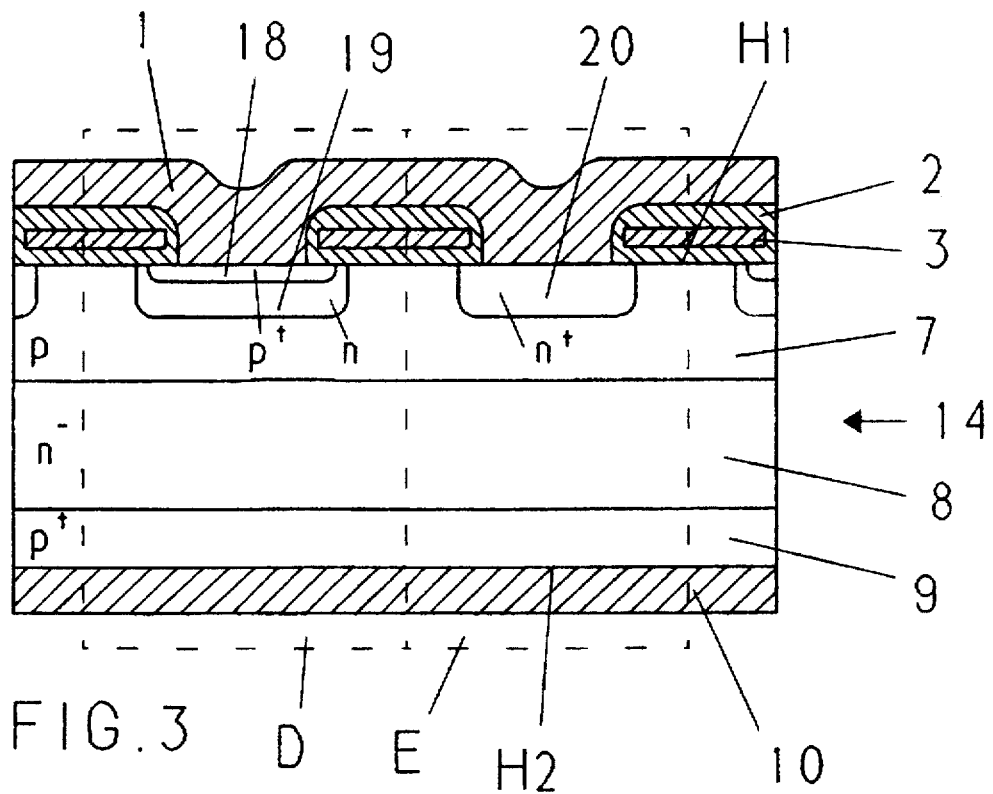
FIG. 3 shows in cross section the integral cells of a first preferred exemplary embodiment of a power semiconductor component according to the invention having separate emitter cells (E) and DMOS cells (D)
Figure 4:
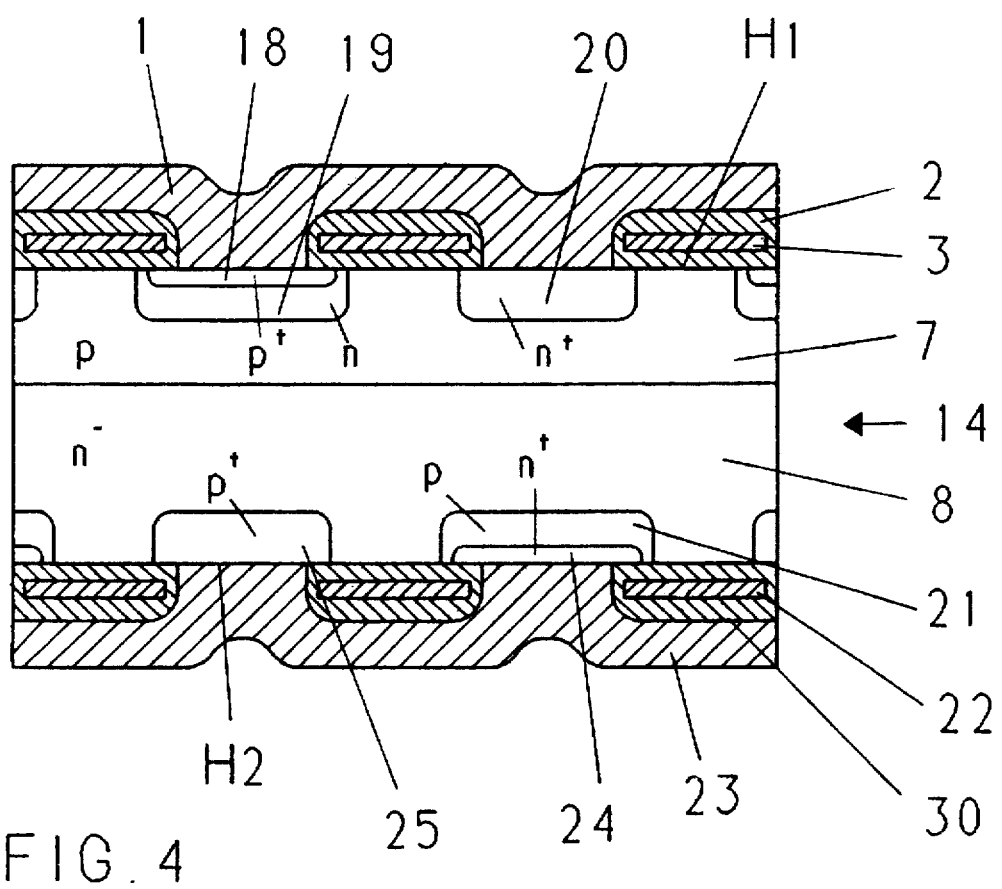
FIG. 4 shows a second preferred exemplary embodiment of a power semiconductor component according to the invention having additional MOS-controlled short circuits on the anode side.

In the embodiment according to FIG. 3, only the cathode side of the component is structured, that is to say subdivided into specific units, while the anode-side emitter layer 9 is applied continuously. In a development of the invention, it is also possible for the anode side of the component to be structured. A possible embodiment of such a component is represented in FIG. 4. In this case, the emitter layer 9 is divided into individual second emitter regions 25 which are located opposite the first channel region 19 inside the DMOS cell D, in each case. Between the second emitter regions 25 and opposite a first emitter region 20 (that is to say inside each emitter cell E) in each case, a second p-doped channel region 21 projects from the second principal face H2 into the first base layer 8.

$n^+$-doped anode short-circuit regions 24 are let into the second channel regions 21 from the second principal face H2 in each case and are contacted by an anode contact 23. In this arrangement, the second channel regions 21 are led up outside the anode short-circuit regions 24 to the second principal face H2 and are covered there by second gate electrodes 22 which are arranged above the second principal face H2 insulated from the semiconductor substrate 14.

All the previous statements relating to the component according to the invention have been restricted to turn-off. The additional function of turn-on has not been considered in this arrangement. It can be realized in the structure reproduced in FIG. 3 with the same MOS gate without applying further masking steps in the production. The modification of the component structure that is required for this purpose is shown in FIG. 5.

Figure 5:
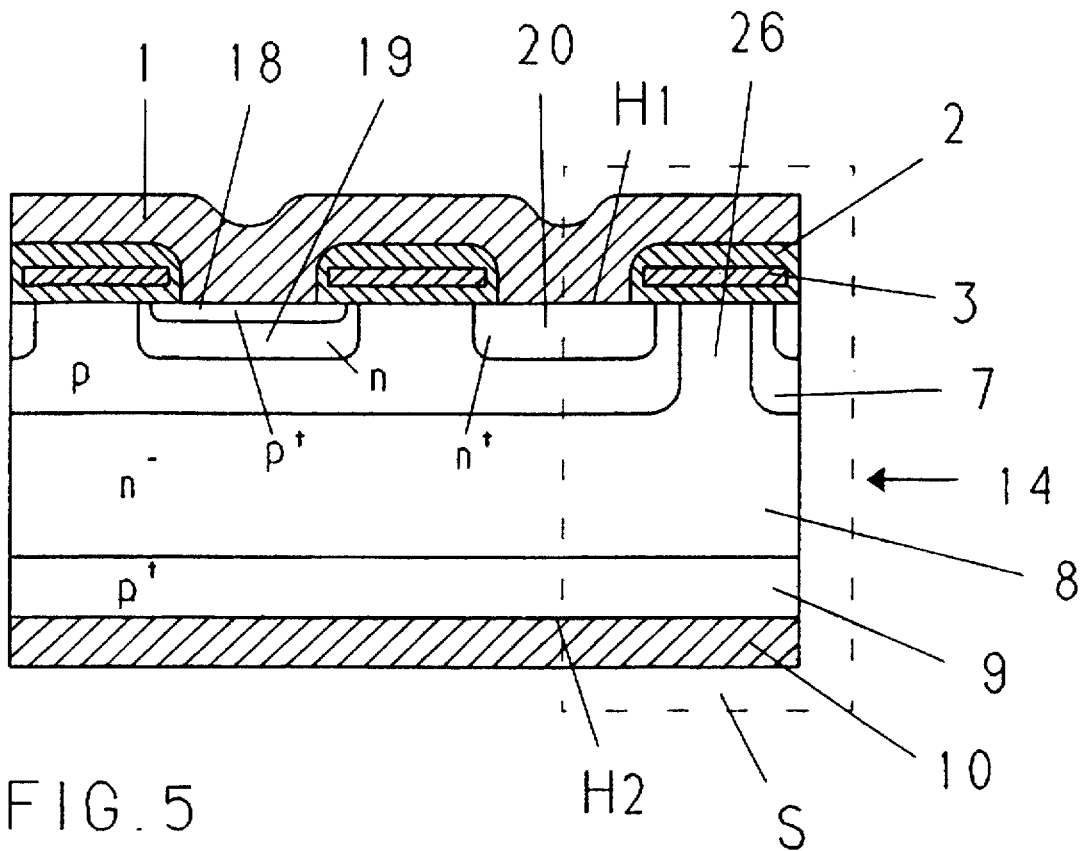
FIG. 5 shows a third preferred exemplary embodiment of a power semiconductor component according to the invention having additional turn-on cells (S) between the emitter and DMOS cells.

In the embodiment according to FIG. 5, there are provided inside the semiconductor substrate 14 in addition to the emitter cells E and the DMOS cells D so-called turn-on cells S which are arranged between the emitter cells E and DMOS cells D and are connected in parallel therewith (indicated in FIG. 5 by a dashed rectangle). In this arrangement, each turn-on cell S adjoins at least one adjacent emitter cell E.

Inside each turn-on cell S, the second base layer 7 and, in an interruption of the second base layer 7, the first base layer 8 are led up one after another to the first principal face H1, the first base layer 8 forming a turn-on region 26 surrounded by the second base layer 7. Moreover, inside each turn-on cell S the first gate electrode 3 also covers the second base layer 7, which is led up between the turn-on region 26 and the first emitter region 20 of the adjacent emitter cell E.

The surface of the led-up second base layer 7 can be inverted by a positive signal at the first gate electrode 3 and thus be rendered conductive for electrons. These electrons flow from the first emitter region 20 of the adjacent emitter cell E through the inversion channels into the turn-on region of the first base layer 8 and lead there to turning on of the component. The level of the turn-on current can be set in this case via the thickness of the turn-on cells S.

If, now, the new structure of FIG. 5 is compared with the known structure of FIG. 1, which has the same electrical functions, it can be seen at once that the new component can be produced with a saving of three masking steps. This means for the large-area components such as thyristors, in particular, that the yield can be increased. The particular advantage of the component according to FIG. 5 resides, on the one hand, in the very simple production process and, on the other hand, in the very low ON resistance. The proposed structure is thus of interest for applications in which a high current carrying capacity (achieved by components having large areas) and simultaneously low static losses are required.

According to another development of the invention, it is possible in addition to integrate an inverse or freewheeling diode into a structure according to FIG. 3. An embodiment of such a combined component is reproduced in FIG. 6.

Figure 6:
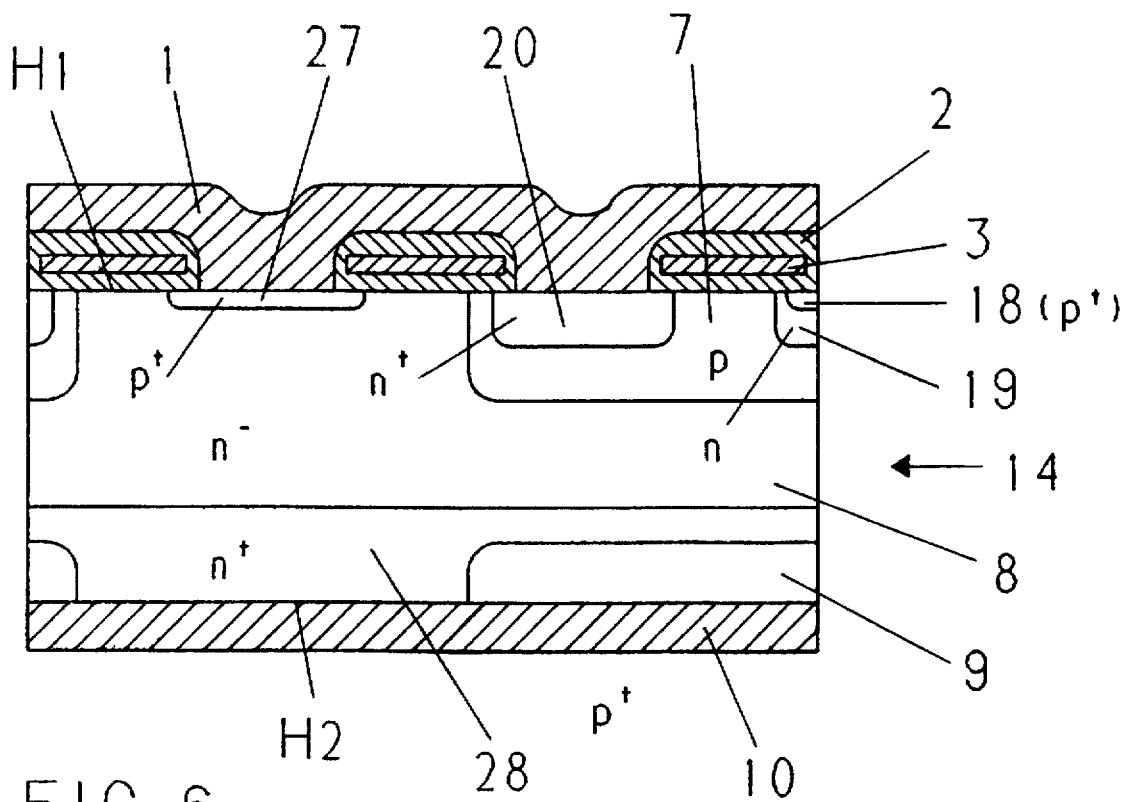
FIG. 6 shows a fourth preferred exemplary embodiment of a power semiconductor component according to the invention having an integrated inverse diode.

In the component of FIG. 6, an $n^+$-doped, continuous interlayer 28 is arranged in the semiconductor substrate 14 between the first base layer 8 and the emitter layer 9. The second base layer 7 is interrupted in predetermined regions, and the first base layer 8 is led up there to the first principal face H1. Furthermore, the emitter layer 9 is also interrupted in these predetermined regions and the interlayer 28 is led up to the second principal face H2. Finally, a $p^+$-doped extraction region 27 projects from the first principal face H1 into the first base layer 8 in these predetermined regions in each case, and is contacted by the cathode contact 1. The sequence of extraction region 27, first base layer 8 and interlayer 28 forms a diode which is connected in antiparallel to the remaining cells.

It may be pointed out at this juncture that self-adjusting processes such as are described in the German Patent Application of reference P 40 24 526.8 mentioned at the beginning can be used for the lithography in order to produce a component according to FIGS. 3–6.

So far only emitter cells E, DMOS cells D and turn-on cells S (which can also be designated as IGBT cells) have been discussed. In principle, these different elementary cells can be combined arbitrarily, in order in this way to achieve the desired component characteristics. Apart from realizing the component with square or rectangular elementary cells, at least a portion of the emitter cells E, DMOS cells D and turn-on cells S can be constructed as elongate strips. Furthermore, it is also possible to use a mixture of square cells and strips. Two exemplary embodiments of such a mixed realization, in which specifically the turn-on cells S are constructed as turn-on strips, are represented in FIGS. 7 and 8.

Figure 7:
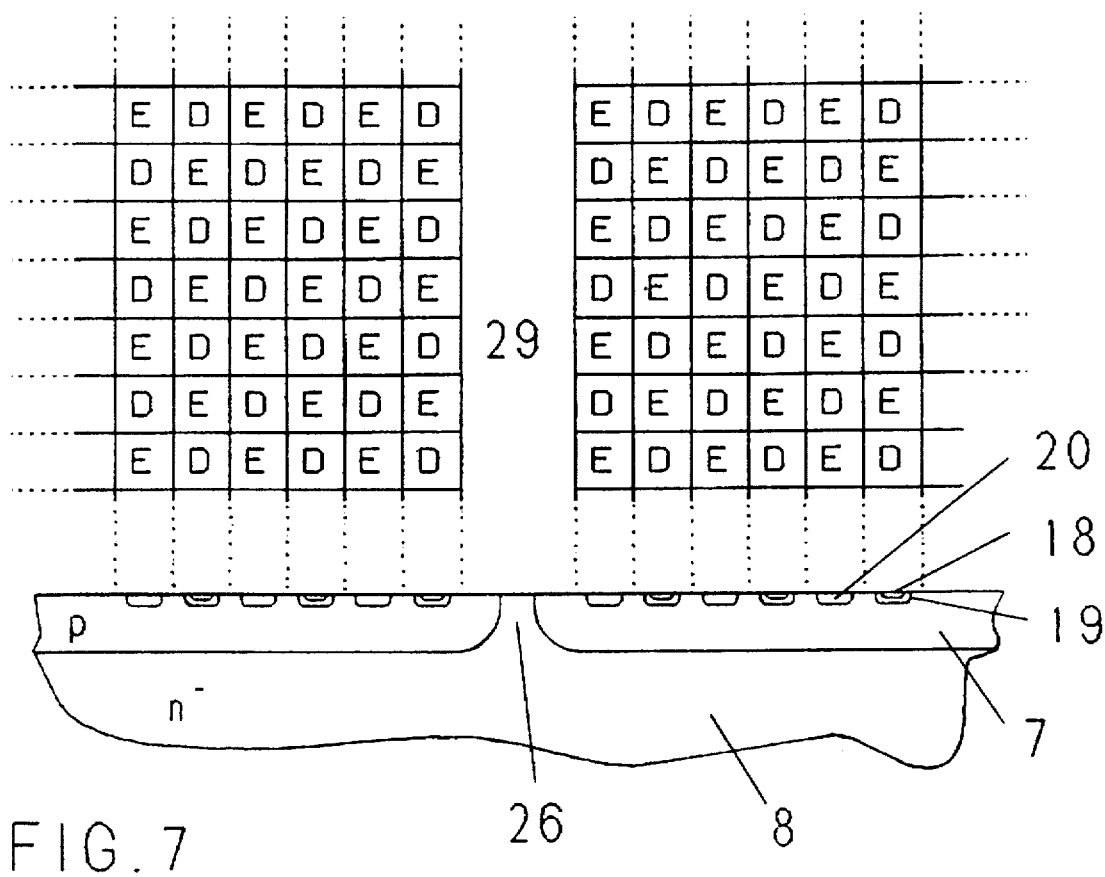
FIG. 7 shows a first exemplary arrangement of an identical number of emitter and DMOS cells having interposed turn-on strips in a component according to the invention.
Figure 8:
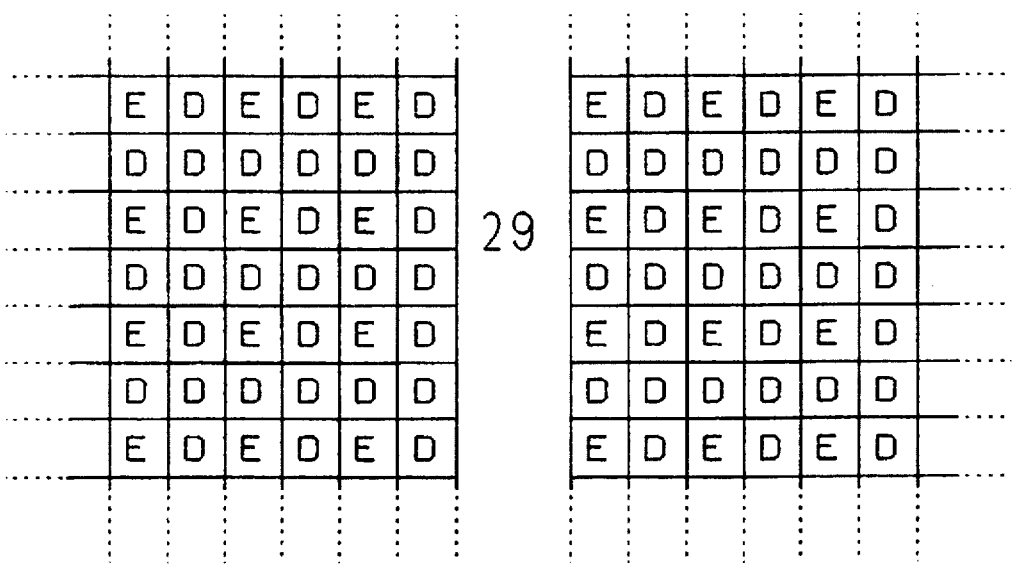
FIG. 8 shows an exemplary cell arrangement differing from FIG. 7 and having a majority of DMOS cells.

In the top part, FIG. 7 shows a plan view from the cathode side of an alternating pattern of square emitter cells E and DMOS cells D, which is interrupted inbetween by a turn-on strip 29. In the bottom part of the Figure, a detail of the associated cross section through the component is reproduced. It may be noted with regard to this embodiment that here there is the same number of DMOS cells D and emitter cells E.

In the component structure according to the invention (FIG. 4), the turn-off capability depends on the ratio of the number of DMOS cells D to the number of the emitter cells E. The fact that the distance of the channels is basically larger by comparison with the known structure of FIG. 1 means that it is necessary here to accept a certain loss in turn-off capacity. This loss can be compensated within certain limits by combining a larger number of DMOS cells D with a smaller number of emitter cells E. An exemplary embodiment of this type of structure is represented in FIG. 8. As to this, it may be remarked that there are no upper limits in this case with respect to the number of the DMOS cells D per emitter cell E.

Figure 9:
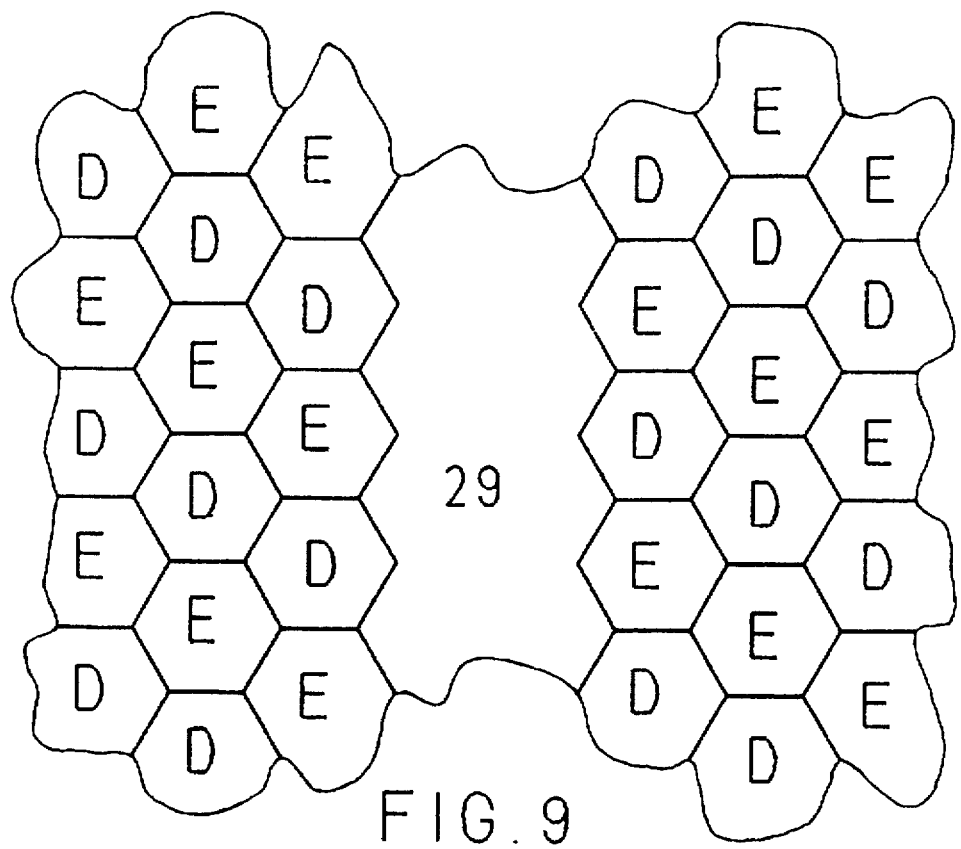
FIG. 9 shows an arrangement corresponding to FIG. 7 having hexagonal emitter and DMOS cells.
Figure 10:
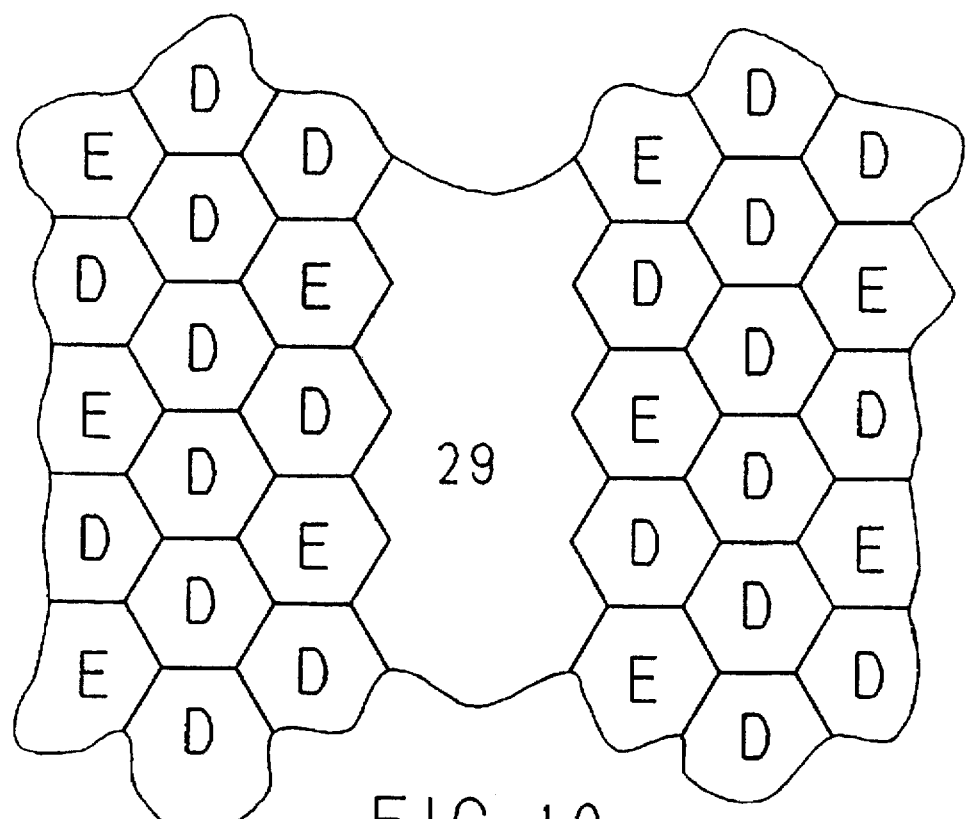
FIG. 10 shows an arrangement corresponding to FIG. 8 having hexagonal emitter and DMOS cells.
Figure 11:
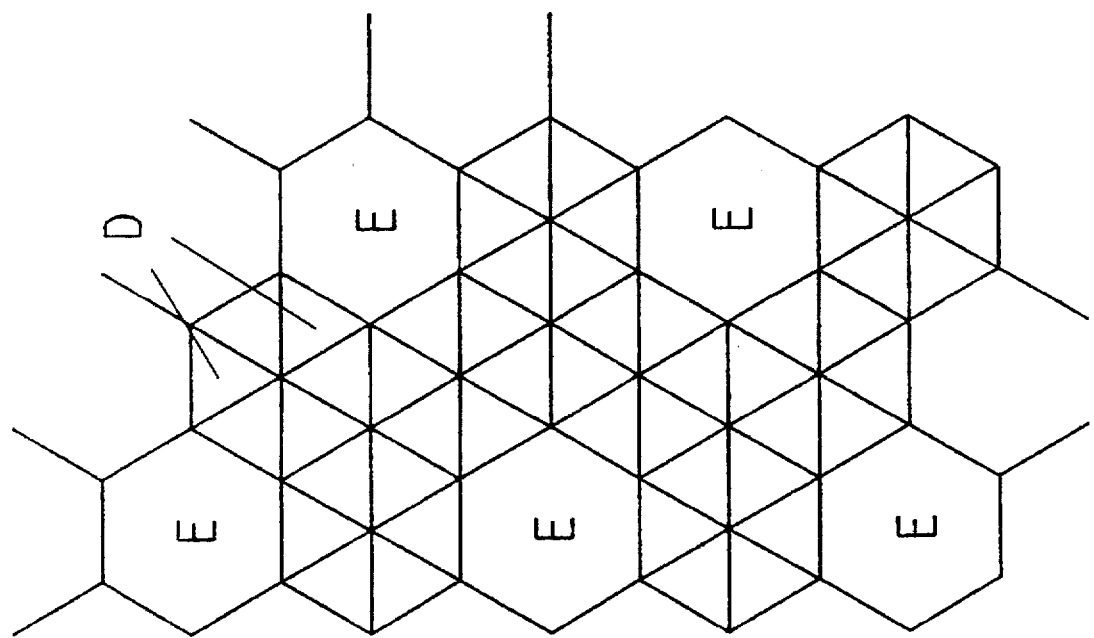
FIG. 11 shows a mixed arrangement of triangular DMOS cells and hexagonal emitter cells.
Figure 11:
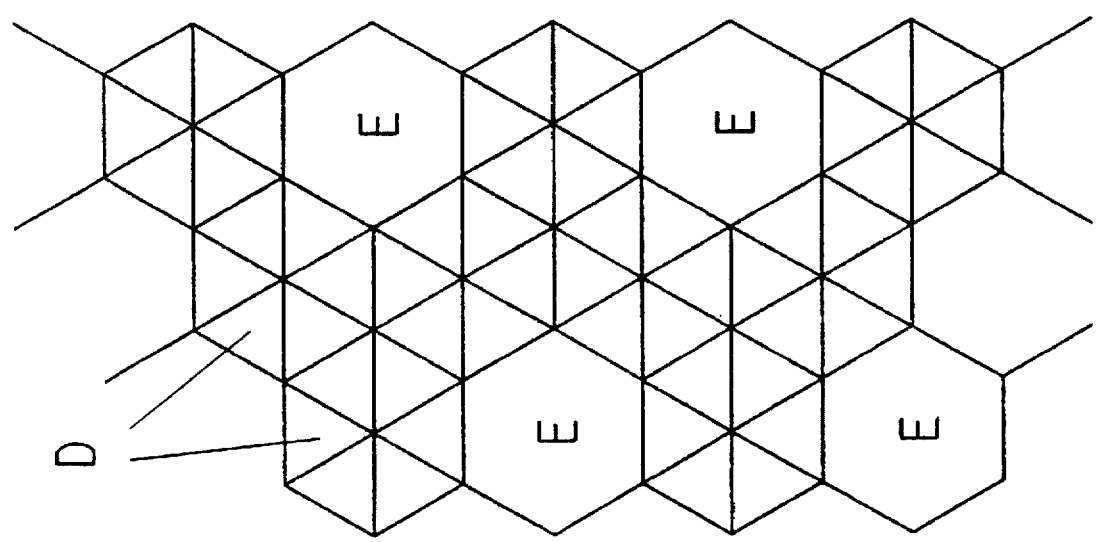

Instead of the rectangular cells described so far, it is also possible, of course, to use other cell geometries within the scope of the invention. FIG. 9 thus represents an arrangement, corresponding to FIG. 7, having an equal number of emitter cells E and DMOS cells D, the individual cells each having a hexagonal geometry. FIG. 10 shows, corresponding to FIG. 8, an embodiment having hexagonal cell geometry, in which the number of the DMOS cells D predominates. Finally, FIG. 11 reproduces a detail of a component in which triangular DMOS cells D are combined with hexagonal emitter cells E.

It may be pointed out in conclusion that instead of being realized with the conductivity types and dopings of the individual layers and regions shown here, the structures described may also be realized with the complementary conductivity types and dopings.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A turn-off, MOS-controlled power semiconductor component comprising:
  (a) a semiconductor substrate of a first conductivity type, which semiconductor substrate is bounded on one side by a first principal surface and on the other side by a second principal surface and forms a first base layer in its interior, the first base layer extending parallel to said second principal surface, said first base layer having a plurality of first regions and a plurality of second regions which are continuous with each other;
  (b) an emitter layer of a second conductivity type opposite to the first conductivity type, which emitter layer projects from the second principal surface into the first base layer;
  (c) a second base layer of the second conductivity type, which second base layer projects from the first principal surface into the first base layer over said plurality of first regions and said plurality of second regions of said base layer, the second base layer having sections thereof which extend to the first principal surface;

(d) a plurality of first emitter regions of the first conductivity type, which project over their entire extent from the first principal surface into the second base layer over respective first regions of said first base layer;

(e) a plurality of first channel regions of the first conductivity type, which project from the first principal surface into the second base layer over respective second regions of said first base layer;

(f) a plurality of cathode short-circuit regions of the second conductivity type, which extend into the first channel regions from the first principal surface in each case, the first channel regions having at least one section which extends outside the cathode short-circuit regions to the first principal surface;

(g) first gate electrodes, which are arranged above the first principal surface, and which cover the sections reaching to the first principal surface of the first channel regions in each case and which are insulated from the semiconductor substrate;

(h) a cathode contact which is applied to the first principal surface and contacts the first emitter regions and the cathode short-circuit regions; and (i) an anode contact which is applied to the second principal surface and contacts the emitter layer; wherein (k) the first emitter regions and the first channel regions are separated from one another by the sections of the second base layer which extend to the first principal surface and which first emitter and first channel regions are arranged laterally next to one another and project into the second base layer; and (l) each first emitter region and each first channel region with the cathode short-circuit region extending into the latter form together with the layers located therebelow an emitter cell or a DMOS cell, respectively, which cells are arranged next to one another and are connected in parallel electrically; and wherein (a) a continuous interlayer of the first conductivity type is arranged between the first base layer and the emitter layer:

(b) the second base layer is interrupted in predetermined regions, and the first base layer is led up there to reach the first principal surface;

(c) in these predetermined regions the emitter layer is interrupted and the interlayer is led up to reach the second principal surface; and (d) in these predetermined regions, an extraction region of the second conductivity type projects in each case from the first principal surface into the first base layer, and is contacted by the cathode contact.

2. The power semiconductor component as claimed in claim 1, wherein the number of the DMOS cells is greater than or equal to the number of the emitter cells.

3. The power semiconductor component as claimed in claim 1, wherein (a) the emitter layer is divided into individual second emitter regions which are located opposite a cathode short-circuit region in each case;

(b) between the second emitter regions and opposite a first emitter region in each case, a second channel region of the second conductivity type projects from the second principal surface into the first base layer;

(c) anode short-circuit regions of the first conductivity type are let into the second channel regions from the second principal surface in each case and are contacted by the anode contact, the second channel regions being led up outside the anode short-circuit regions to reach the second principal surface; and (d) second gate electrodes are provided which are arranged above the second principal surface over the led-up second channel regions and insulated from the semiconductor substrate.

4. A turn-off, MOS-controlled power semiconductor component comprising:

(a) a semiconductor substrate of a first conductivity type, which semiconductor substrate is bounded on one side by a first principal surface and on the other side by a second principal surface and forms a first base layer in its interior, the first base layer extending parallel to said second principal surface, said first base layer having a plurality of first regions and a plurality of second regions which are continuous with each other;

(b) an emitter layer of a second conductivity type opposite to the first conductivity type, which emitter layer projects from the second principal surface into the first base layer;

(c) a second base layer of the second conductivity type, which second base layer projects from the first principal surface into the first base layer over said plurality of first regions and said plurality of second regions of said base layer, the second base layer having sections thereof which extend to the first principal surface;

(d) a plurality of first emitter regions of the first conductivity type, which project over their entire extent from the first principal surface into the second base layer over respective first regions of said first base layer;

(e) a plurality of first channel regions of the first conductivity type, which project from the first principal surface into the second base layer over respective second regions of said first base layer;

(f) a plurality of cathode short-circuit regions of the second conductivity type, which extend into the first channel regions from the first principal surface in each case, the first channel regions having at least one section which extends outside the cathode short-circuit regions to the first principal surface;

(g) first gate electrodes, which are arranged above the first principal surface, and which cover the sections reaching to the first principal surface of the first channel regions in each case and which are insulated from the semiconductor substrate;

(h) a cathode contact which is applied to the first principal surface and contacts the first emitter regions and the cathode short-circuit regions; and (i) an anode contact which is applied to the second principal surface and contacts the emitter layer; wherein (k) the first emitter regions and the first channel regions are separated from one another by the sections of the second base layer which extend to the first principal surface and which first emitter and first channel regions are arranged laterally next to one another and project into the second base layer;

(l) each first emitter region and each first channel region with the cathode short-circuit region extending into the latter form together with the layers located therebelow an emitter cell or a DMOS cell, respectively, which cells are arranged next to one another and are connected in parallel electrically;

(m) in addition to the emitter cells and the DMOS cells, turn-on cells are provided which are arranged between the emitter cells and DMOS cells and are connected in parallel thereto, each turn-on cell adjoining at least one adjacent emitter cell;

(n) inside each turn-on cell, the second base layer and, in an interruption of the second base layer, the first base layer extend one after another to the first principal surface, the first base layer forming a turn-on region surrounded by the second base layer; and (o) inside each turn-on cell, the first gate electrode also covers the second base layer, which extends between the turn-on region and the first emitter region of the adjacent emitter cell.

5. The power semiconductor component as claimed in claim 4, wherein at least a portion of the emitter cells, DMOS cells and turn-on cells are constructed as strips.

6. The power semiconductor component as claimed in claim 5, wherein the turn-on cells are constructed as strips.

7. The power semiconductor component as claimed in one of claims 1 to 3, wherein the first conductivity type is the n-type and the second conductivity type is the p-type.

8. The power semiconductor component as claimed in claim 7, wherein the first base layer is $n^-$-doped, the second base layer is p-doped, the emitter layer and the cathode short-circuit regions are $p^+$-doped, the first channel regions are n-doped and the first emitter regions are $n^+$-doped.

* * * * *